United States Patent
Nishido

(10) Patent No.: US 9,755,189 B2
(45) Date of Patent: Sep. 5, 2017

(54) METHOD FOR FORMING PROJECTIONS AND DEPRESSIONS, SEALING STRUCTURE, AND LIGHT-EMITTING DEVICE

(71) Applicant: Semiconductor Energy Laboratory Co., Ltd., Kanagawa-ken (JP)

(72) Inventor: Yusuke Nishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/211,444

(22) Filed: Jul. 15, 2016

(65) Prior Publication Data

US 2016/0322608 A1    Nov. 3, 2016

Related U.S. Application Data

(62) Division of application No. 14/254,066, filed on Apr. 16, 2014, now Pat. No. 9,394,614.

(30) Foreign Application Priority Data

Apr. 19, 2013    (JP) .................................. 2013-088000

(51) Int. Cl.
  *H01L 33/52*    (2010.01)
  *H01L 51/52*    (2006.01)
  *C23F 1/02*    (2006.01)
  *H01L 21/033*    (2006.01)
  *C23F 1/12*    (2006.01)
  *C23F 1/44*    (2006.01)
  *H01L 51/56*    (2006.01)

(52) U.S. Cl.
  CPC ............ *H01L 51/5281* (2013.01); *C23F 1/02* (2013.01); *C23F 1/12* (2013.01); *C23F 1/44* (2013.01); *H01L 21/0332* (2013.01); *H01L 21/0337* (2013.01); *H01L 33/52* (2013.01); *H01L 51/52* (2013.01); *H01L 51/524* (2013.01); *H01L 51/5246* (2013.01); *H01L 51/56* (2013.01); *Y10T 428/24355* (2015.01)

(58) Field of Classification Search
  CPC ............ H01L 21/0332; H01L 21/0335; H01L 21/0337; H01L 33/52; H01L 33/54; H01L 51/524; H01L 51/5243; H01L 51/5246; C23F 1/02; C23F 1/12; C23F 1/44
  See application file for complete search history.

(56) References Cited

U.S. PATENT DOCUMENTS 6,569,775 B1    5/2003    Loewenhardt et al.
6,717,359 B2    4/2004    Kimura
(Continued)

FOREIGN PATENT DOCUMENTS

JP    2001-064029 A    3/2001
JP    2007-200835 A    8/2007

*Primary Examiner* — Stephen W Smoot
(74) *Attorney, Agent, or Firm* — Husch Blackwell LLP

(57) ABSTRACT

A novel method for forming projections and depressions is provided. A novel sealing structure is provided. A novel light-emitting device is provided. A first step of forming a film containing at least two kinds of metals having different etching rates over a surface; a second step of heating the film so that the metal having a lower etching rate segregates; a third step of selectively etching the metal having a higher etching rate; and a fourth step of selectively etching the surface using a residue containing the metal having a lower etching rate are included.

13 Claims, 9 Drawing Sheets

(56) References Cited

U.S. PATENT DOCUMENTS

| | | |
|---|---|---|
| 7,362,398 B2 | 4/2008 | Satake et al. |
| 7,610,794 B2 | 11/2009 | Yamaguchi et al. |
| 7,728,948 B2 | 6/2010 | Nishi et al. |
| 7,795,803 B2 * | 9/2010 | Kim ............... H01L 51/524 313/504 |
| 7,875,419 B2 | 1/2011 | Nagai et al. |
| 7,956,978 B2 | 6/2011 | Zhang |
| 8,629,445 B2 | 1/2014 | Tanaka et al. |
| 8,999,818 B2 | 4/2015 | Takahashi et al. |
| 2001/0041453 A1 | 11/2001 | Ohuchi |
| 2005/0280363 A1 * | 12/2005 | Han ............... H01L 51/5256 313/506 |
| 2007/0170854 A1 | 7/2007 | Kwak |
| 2011/0162702 A1 | 7/2011 | Carruthers et al. |
| 2013/0134570 A1 | 5/2013 | Nishido |
| 2013/0241286 A1 | 9/2013 | Yamazaki |
| 2013/0252088 A1 | 9/2013 | Kuriki et al. |
| 2014/0001467 A1 | 1/2014 | Yamazaki et al. |

* cited by examiner

METHOD FOR FORMING PROJECTIONS AND DEPRESSIONS, SEALING STRUCTURE, AND LIGHT-EMITTING DEVICE

This application is a divisional of U.S. application Ser. No. 14/254,066, filed on Apr. 16, 2014 (now U.S. Pat. No. 9,394,614 issued Jul. 19, 2016) which is incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, or a manufacturing method thereof. In particular, the present invention relates to a method for forming projections and depressions, a sealing structure, or a light-emitting device. In particular, the present invention relates to a method for forming a substrate whose surface has projections and depressions, a sealing structure including a space surrounded by a substrate with projections and depressions, a sealing substrate, and a sealant for bonding the substrates, and a light-emitting device including a sealed light-emitting element.

2. Description of the Related Art

A substrate whose surface has projections and depressions is used for a variety of devices. The substrate whose surface has projections and depressions can be used as, for example, a diffusion plate of a light-emitting device.

Functions of some functional elements are impaired because of impurity diffusion. In order to maintain the functions of such functional elements, the following invention is known (Patent Document 1): a functional element is sealed in a space surrounded by a substrate provided with the functional elements, a sealing substrate, and a sealant for bonding the substrate and the sealing substrate.

Patent Document 1: Japanese Published Patent Application No. 2007-200835

SUMMARY OF THE INVENTION

A method for selectively forming projections and depressions that can improve the function of a device is required.

A sealing structure which suppresses diffusion of impurities into a sealed structure is required.

One embodiment of the present invention is made in view of the foregoing technical background. Thus, an object is to provide a novel method for forming projections and depressions. Another object is to provide a novel sealing structure. Another object is to provide a novel light-emitting device.

One embodiment of the present invention is a method for forming projections and depressions that includes a first step of forming a film containing a first metal and a second metal whose etching rate is lower than that of the first metal over one surface, a second step of heating the film so that the second metal segregates, a third step of selectively etching the first metal, and a fourth step of selectively etching the one surface using a residue containing the second metal as a resist mask.

In the method for forming projections and depressions of one embodiment of the present invention, a film containing aluminum as the first metal and nickel as the second metal is formed in the first step and a gas containing chlorine is used for the etching in each of the third step and the fourth step.

The method for forming projections and depressions of one embodiment of the present invention includes the steps of: forming the film containing the metals having different etching rates over the surface; heating the film so that the metal having a lower etching rate segregates; selectively etching the metal having a higher etching rate; and selectively etching the surface using the residue containing the metal having a lower etching rate as the resist mask. This method can form projections and depressions over one surface. As a result, a novel method for forming projections and depressions can be provided.

In the method for forming projections and depressions of one embodiment of the present invention, the film is selectively etched in the third step.

The method for forming projections and depressions of one embodiment of the present invention includes a step of selectively etching the film using a resist mask or the like formed in an island shape or the like. This method can form an island-shaped film over one surface and projections and depressions adjacent to the island-shaped film. As a result, a novel method for forming projections and depressions adjacent to a film can be provided.

Another embodiment of the present invention is a sealing structure that includes a substrate, a sealing substrate facing one surface of the substrate, a sealant for bonding the substrate and the sealing substrate, and a sealed structure sealed in a region surrounded by the substrate, the sealing substrate, and the sealant. The one surface of the substrate has projections and depressions, a surface that is adjacent to the projections and depressions and is flatter and smoother than the projections and depressions, and an island-shaped film overlapping the flat and smooth surface. The sealant is in contact with the projections and depressions.

In the sealing structure of one embodiment of the present invention, the sealant that is in contact with the projections and depressions adjacent to the film bonds the substrate and the sealing substrate. This can increase the area in which the sealant is in contact with the sealing substrate and increase the bonding strength of the substrates. As a result, a novel sealing structure can be provided.

In the sealing structure of one embodiment of the present invention, one surface of the sealing substrate has projections and depressions, a surface that is adjacent to the projections and depressions and is flatter and smoother than the projections and depressions, and an island-shaped film that is overlapped with the flat and smooth surface. The sealant is in contact with the film and contains glass whose melting point is higher than or equal to 300° C. and lower than or equal to 700° C.

The sealing structure of one embodiment of the present invention has a structure in which the sealant containing the low melting point glass is in contact with the projections and depressions adjacent to the film provided for the sealing substrate and bonds the sealing substrate and the substrate. With such a structure, the sealant is welded to the substrate, so that the sealant is firmly welded to the substrate having the projections and depressions adjacent to the film. In addition, the area of the film that overlaps the sealant can be adjusted. As a result, a novel sealing structure can be provided.

Another embodiment of the present invention is a light-emitting device that includes a substrate, a sealing substrate facing one surface of the substrate, a sealant for bonding the substrate and the sealing substrate, and a light-emitting element sealed in a region surrounded by the substrate, the sealing substrate, and the sealant. The one surface of the substrate has projections and depressions, a surface that is adjacent to the projections and depressions and is flatter and smoother than the projections and depressions, and an island-shaped conductive film that overlaps the flat and smooth surface. The light-emitting element is electrically connected to the conductive film. The sealant is in contact with the projections and depressions.

The light-emitting device of one embodiment of the present invention includes the light-emitting element, the conductive film that is electrically connected to the light-emitting element, and the sealant that is in contact with the projections and depressions adjacent to the conductive film, and the light-emitting element is sealed in the region surrounded by the sealant, the substrate, and the sealing substrate. The structure enables electric power to be supplied to the light-emitting element through the conductive film. In addition, the area in which the sealant is in contact with the substrate can be increased and the bonding strength can be increased. As a result, a novel light-emitting device in which diffusion of impurities to a light-emitting element is suppressed can be provided.

Note that in this specification, an "EL layer" refers to a layer provided between a pair of electrodes in a light-emitting element. Thus, a light-emitting layer containing an organic compound that is a light-emitting substance, which is interposed between electrodes, is one embodiment of the EL layer.

In this specification, in the case where a substance A is dispersed in matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device, a light-emitting device, or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

According to one embodiment of the present invention, a novel method for forming projections and depressions can be provided. A novel sealing structure can also be provided. A novel light-emitting device can also be provided.

BRIEF DESCRIPTION OF THE DRAWINGS

FIGS. 2A-1, 2A-2, 2B-1, 2B-2, 2C-1, and 2C-2 illustrate a method for forming a substrate with a light-emitting element by using a method for forming projections and depressions of an embodiment.

FIGS. 3A-1, 3A-2, 3B-1, 3B-2, 3C-1, 3C-2, 3D-1, and 3D-2 illustrate a method for forming projections and depressions of an embodiment.

FIGS. 4A-1, 4A-2, 4B-1, 4B-2, 4C-1, and 4C-2 illustrate a method for forming a sealing substrate by using a method for forming projections and depressions of the embodiment.

DETAILED DESCRIPTION OF THE INVENTION

Figures 1, 1A:
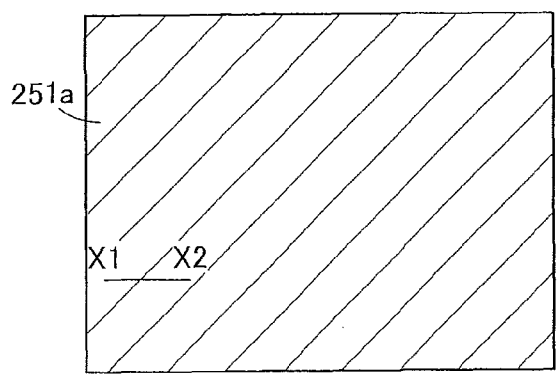
FIGS. 1A-1, 1A-2, 1B-1, 1B-2, 1C-1, 1C-2, 1D-1, and 1D-2 illustrate a method for forming projections and depressions of an embodiment.

<Example of Problem Solvable by One Embodiment of the Present Invention>

A sealing structure in which a sealed structure is sealed in a space surrounded by a substrate, a sealing substrate facing the substrate, and a sealant for bonding the substrate and the sealing substrate is known. When the sealant has insufficient strength to bond the substrate and the sealing substrate, the sealing structure is broken, in some cases resulting in exposure of the sealed body to the outside environment.

In particular, when the surface of the substrate with which the sealant is in contact is flat and smooth, the sealant is in some cases easily separated from the substrate.

<One Embodiment of the Present Invention>

In view of the above, one embodiment of the present invention focuses on the form of a substrate surface. The embodiments described below include one embodiment of the present invention that is created focusing on a structure in which a substrate surface in contact with a sealant has projections and depressions.

A method for forming projections and depressions of one embodiment of the present invention includes a first step of forming a film containing metals having different etching rates over a surface, a second step of heating the film so that the metal having a lower etching rate segregates, a third step of selectively etching the metal having a higher etching rate, and a fourth step of selectively etching a substrate using a residue containing the metal having a lower etching rate as a resist mask.

The above-described method can form projections and depressions on the surface of the substrate. As a result, a novel method for manufacturing projections and depressions can be provided.

Embodiments are described in detail with reference to the drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments. In the structures of the present invention described below, the same portions or portions having similar functions are denoted by the same reference numerals in different drawings, and explanation thereof is not be repeated.

(Embodiment 1)

In this embodiment, a method for forming projections and depressions of one embodiment of the present invention is described with reference to FIGS. 1A-1, 1A-2, 1B-1, 1B-2, 1C-1, 1C-2, 1D-1, and 1D-2. Specifically, a method for forming a substrate, one surface of which has projections and depressions is described as an example.

Figures 1, 1A, 2:
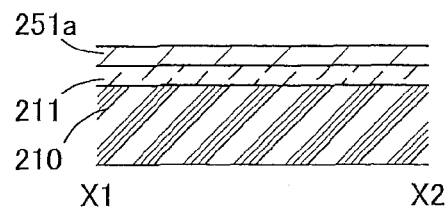
Figures 1, 1B:
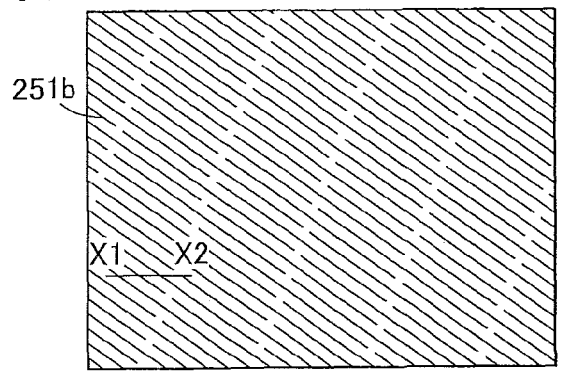
Figures 1, 1B, 2:
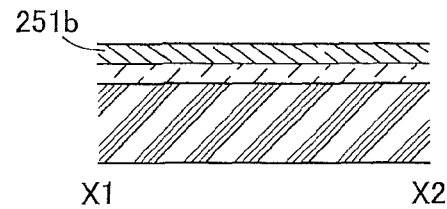
Figures 1, 1C:
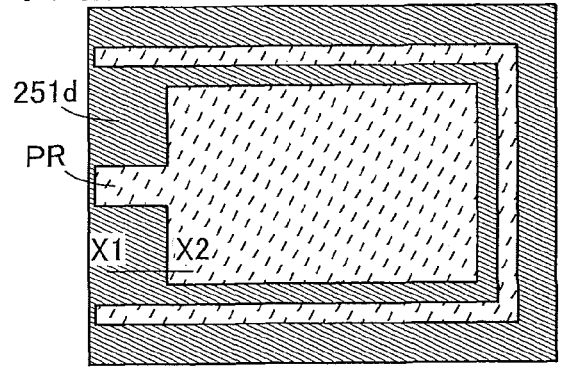
Figures 1, 1C, 2:
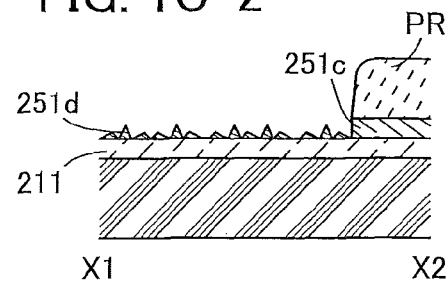
Figures 1, 1D:
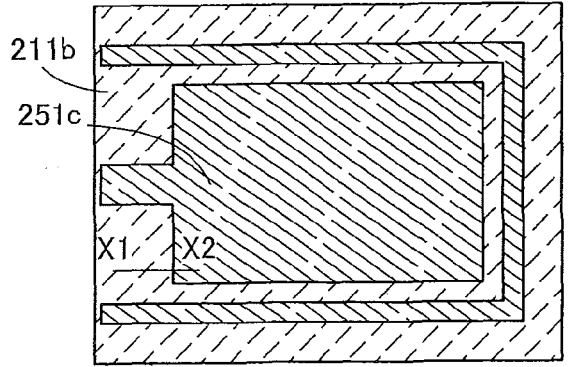
Figures 1, 1D, 2:
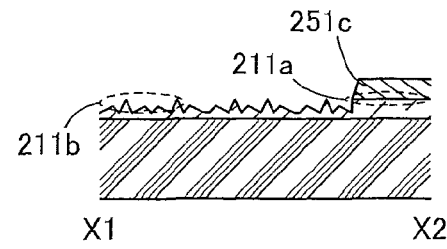

FIGS. 1A-1 to 1D-1 are each a top view of a substrate for illustrating the method for forming projections and depressions of one embodiment of the present invention. In addition, FIGS. 1A-2, 1B-2, 1C-2, and 1D-2 are cross-sectional views of the substrate taken along the section line X1-X2 in FIGS. 1A-1, 1B-1, 1C-1, and 1D-1, respectively.

<Method for Forming Projections and Depressions>

The method for forming projections and depressions of one embodiment of the present invention includes the following four steps.

<<First Step>>

In the first step, a film 251a containing a first metal and a second metal whose etching rate is lower than that of the first metal is formed over a surface 211 of an insulating film formed over a substrate 210 (see FIGS. 1A-1 and 1A-2).

Note that although a case where projections and depressions are formed over the surface 211 of the insulating film formed over the substrate 210 is described in this embodiment, one embodiment of the present invention is not limited thereto. For example, projections and depressions can be formed directly on a surface of the substrate 210.

<<Second Step>>

In the second step, the film 251a is heated so that the second metal segregates. A film 251b is a film in which the second metal has segregated (see FIGS. 1B-1 and 1B-2).

Note that the second metal segregates, so that the second metal elements are non-uniformly distributed in the film 251b.

<<Third Step>>

In the third step, the first metal is etched selectively or preferentially. Thus, a residue 251d containing the second metal is formed (see FIGS. 1C-1 and 1C-2).

Note that distribution of the residue 251d over the surface 211 is not uniform because of the segregation of the second metal in the second step.

<<Fourth Step>>

In the fourth step, the surface 211 is selectively etched using the residue 251d as a resist mask (see FIGS. 1D-1 and 1D-2).

The residue 251d containing the second metal is not easily etched. Thus, the residue 251d functions as a resist mask for the surface 211 under the residue 251d. In addition, the residue 251d is distributed non-uniformly over the surface 211. As a result, irregular projections and depressions 211b can be formed over the surface 211. Note that the residue 251d is in some cases etched at a higher rate than the first metal or removed by washing.

The method for forming projections and depressions in this embodiment includes a step of forming a film containing metals having different etching rates over a surface; a step of heating the film so that the metal having a lower etching rate segregates; a step of selectively etching the metal having a higher etching rate; and a step of selectively etching the surface using a residue containing the metal having a lower etching rate as a resist mask. This method can form projections and depressions over one surface. As a result, a novel method for forming projections and depressions can be provided.

Individual steps of the manufacturing method in this embodiment are described below.

In the method for forming projections and depressions of one embodiment of the present invention, a film containing a first metal and a second metal that can segregate and has an etching rate lower than that of the first metal is used.

Specifically, the film 251a that contains aluminum as the first metal and nickel as the second metal is formed in the first step.

When the atomic percentage of nickel to aluminum included in the film 251a is greater than or equal to 0.1 atom % and less than or equal to 10 atom %, particularly greater than or equal to 0.1 atom % and less than or equal to 5 atom %, a high reflectivity can be obtained.

For example, a film that is formed by a sputtering method using aluminum containing nickel at 2 atom % and lanthanum at 0.35 atom % as a target can be used.

As an example of a method for segregating nickel in the film 251b, heat treatment on the formed film 251a can be given. Specifically, heat treatment at higher than or equal to 200° C. and lower than or equal to 350° C. can be given.

Note that in the case where a material in which the second metal segregates without heat treatment performed on a formed film is used, the step for segregating the second metal can be omitted.

An etching gas that can be used in the method for forming projections and depressions of one embodiment of the present invention is selected in accordance with the quality of the metal contained in the film, particularly, the second metal that segregates from the first metal.

The first metal, the second metal, and the etching gas are selected so that the etching rate of the first metal is preferably 0.5 times or more and 0.8 times or less as high as that of the second metal.

In the case of using, for example, aluminum as the first metal and nickel as the second metal, a gas containing chlorine can be used for the etching in each of the third step and the fourth step. Specifically, a boron trichloride gas, a chlorine gas, or the like or a mixed gas of any of the above gases can be used. Examples of the second metal that is not easily etched by a gas containing chlorine are chromium and iron as well as nickel.

In addition, an island-shaped film 251c can be formed from the film 251b with the use of a resist mask PR in the third step (see FIGS. 1C-1 and 1C-2). Note that the resist mask PR is removed after the film 251c is formed.

The island-shaped film 251c that the resist mask PR overlaps is protected from the etching gas.

In the fourth step, the residue 251d containing the second metal, which is distributed non-uniformly over the surface 211, functions as a resist mask for the surface 211 under the residue 251d. As a result, the irregular projections and depressions 211b can be formed over the surface 211. Note that the state of a surface 211a that the resist mask PR and the island-shaped film 251c overlap is maintained. As a result, the surface 211a that is flatter and smoother than the surface having the projections and depressions 211b and the island-shaped film 251c that overlaps the surface 211a can be formed.

<Modified Example: Method for Forming Substrate Provided with Light-emitting Element>

As a modified example of this embodiment, a method for forming a substrate having projections and depressions that is provided with a light-emitting element is described with reference to FIGS. 2A-1, 2A-2, 2B-1, 2B-2, 2C-1, and 2C-2.

FIGS. 2A-1, 2B-1, and 2C-1 are each a top view of a substrate for illustrating the method for forming a substrate having projections and depressions that is provided with a light-emitting element, which is the modified example of this embodiment. In addition, FIGS. 2A-2, 2B-2, and 2C-2 are cross-sectional views of the substrate taken along the section lines X1-X2 in FIGS. 2A-1, 2B-1, and 2C-1, respectively.

Figures 1, 2A:
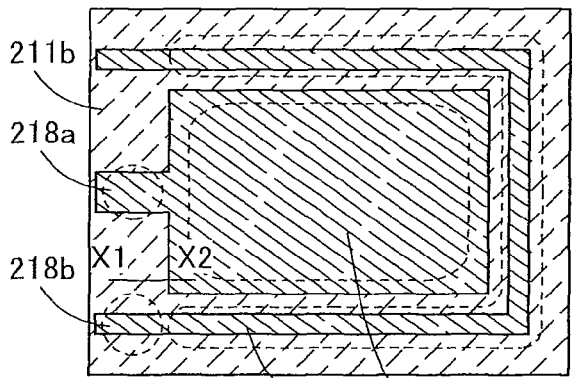
Figures 2, 2A:
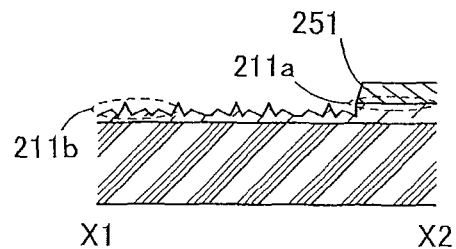

The modified example of this embodiment is different from the above-described method in that the film 251c has conductivity. In the modified example, a method similar to the above-described method can be used for the steps up to and including the fourth step. Therefore, the description given above is referred to for the steps up to and including the fourth step, and the fifth and subsequent steps are described below. Note that FIGS. 2A-1 and 2A-2 illustrate a structure of the substrate after the fourth step.

An island-shaped film formed using the conductive film includes a lower electrode 251 of a light-emitting element formed later, a first terminal 218a that can supply electric power to the lower electrode 251, a connection portion 252c that can be electrically connected to an upper electrode of the light-emitting element, and a second terminal 218b that can supply electric power to the connection portion 252c.

<<Fifth Step>>

Figures 1, 2B:
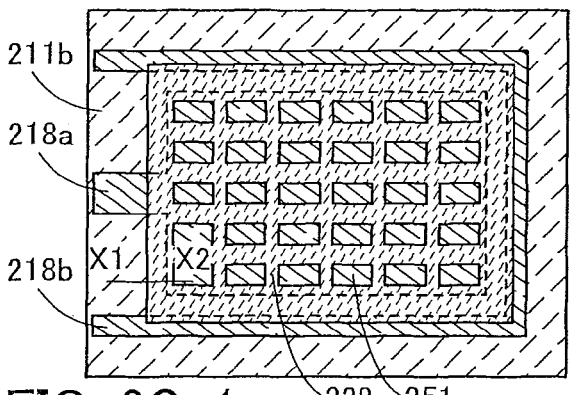
Figures 2, 2B:
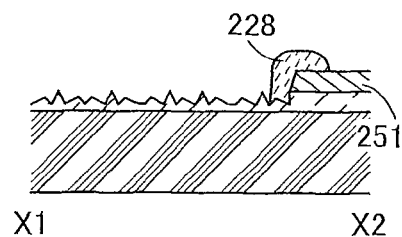

In the fifth step, an insulating partition 228 is formed (see FIGS. 2B-1 and 2B-2).

The partition 228 covers an end portion of the lower electrode 251 and an end portion of the connection portion 252c and has an opening that overlaps the lower electrode 251.

<<Sixth Step>>

Figures 1, 2C:
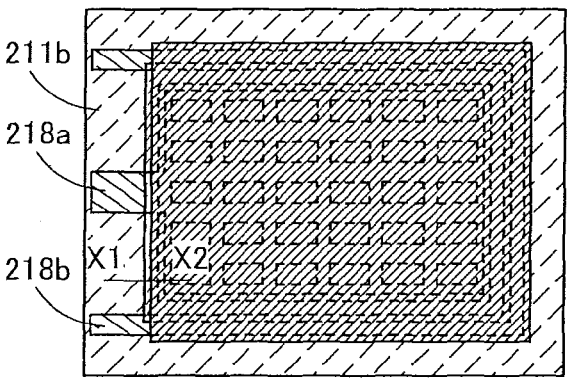
Figures 2, 2C:
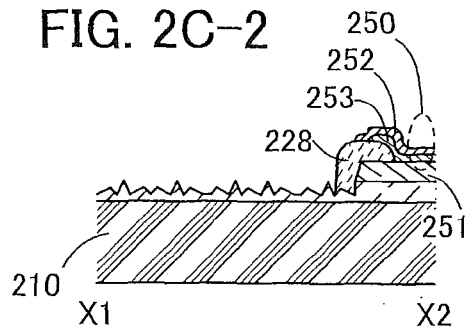

In the sixth step, a light-emitting element 250 is formed (see FIGS. 2C-1 and 2C-2).

A layer 253 containing a light-emitting organic compound is formed so as to cover the lower electrode 251 partly exposed from the opening of the partition 228. Note that layer 253 containing a light-emitting organic compound is formed so as not to cover the connection portion 252c.

After that, an upper electrode 252 is formed. The layer 253 containing a light-emitting organic compound is interposed between the upper electrode 252 and the lower electrode 251. The upper electrode 252 is electrically connected to the connection portion 252c.

In the modified example of this embodiment, a conductive film that transmits visible light is used for the upper electrode 252. Thus, light can be emitted to the upper electrode 252 side in the light-emitting element 250.

Note that a light-transmitting film may be formed in addition to the film for forming the projections and depressions 211b and then the light-transmitting film may be processed into an island shape to be used as the bottom electrode. This enables a light-emitting element in which light is emitted to the lower electrode side to be formed.

Through the above-described steps, the light-emitting element 250 can be formed over the substrate 210. Note that the light-emitting element 250 is not sealed at this stage.

The structure of the light-emitting element and materials for the lower electrode, the upper electrode, and the like, which can be used in this embodiment, are described in detail in Embodiment 4.

This embodiment can be combined as appropriate with any of the other embodiments in this specification.

(Embodiment 2)

In this embodiment, a method for forming projections and depressions of one embodiment of the present invention is described with reference to FIGS. 3A-1, 3A-2, 3B-1, 3B-2, 3C-1, 3C-2, 3D-1, and 3D-2. Specifically, a method for forming a substrate, one surface of which has projections and depressions is described as an example.

FIGS. 3A-1, 3B-1, 3C-1, and 3D-1 are each a top view of a substrate for illustrating the method for forming projections and depressions of one embodiment of the present invention. In addition, FIGS. 3A-2, 3B-2, 3C-2, and 3D-2 are cross-sectional views of the substrate taken along the section line Y1-Y2 in FIGS. 3A-1, 3B-1, 3C-1, and 3D-1, respectively.

<Method for Forming Projections and Depressions>

The method for forming projections and depressions of one embodiment of the present invention includes the following four steps.

<<First Step>>

Figures 1, 3A:
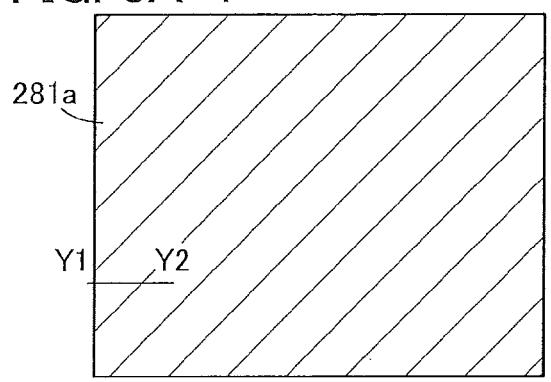
Figures 2, 3A:
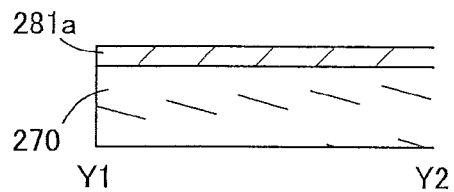
Figures 1, 3B:
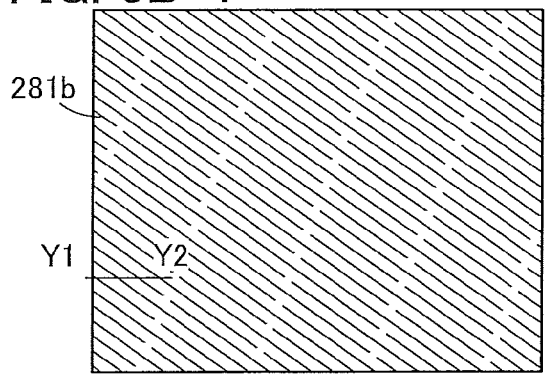
Figures 2, 3B:
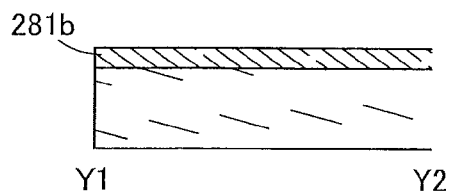
Figures 1, 3C:
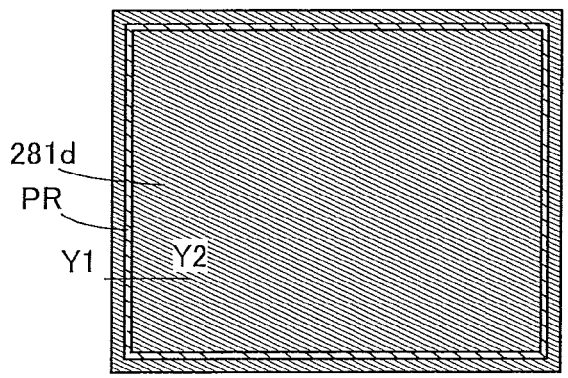
Figures 2, 3C:
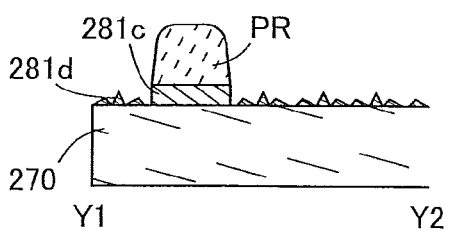

In the first step, a film 281a containing aluminum and nickel whose etching rate is lower than that of aluminum is formed over one surface of a sealing substrate 270 (see FIGS. 3A-1 and 3A-2).

<<Second Step>>

In the second step, the film 281a is heated so that nickel segregates. The film 281b is a film in which nickel has segregated (see FIGS. 3B-1 and 3B-2).

Note that nickel segregates, so that nickel is non-uniformly distributed in the film 281b.

<<Third Step>>

In the third step, aluminum contained in the film 281b is etched selectively or preferentially using a gas containing chlorine. Thus, a residue 281d containing nickel is formed (see FIGS. 3C-1 and 3C-2). In addition, an island-shaped film 281c is formed using the film 281b with the use of a resist mask PR.

The island-shaped film 281c that the resist mask PR overlaps is protected from the etching gas.

Note that distribution of the residue 281d over the sealing substrate 270 is not uniform because of the segregation of nickel in the second step.

<<Fourth Step>>

Figures 1, 3D:
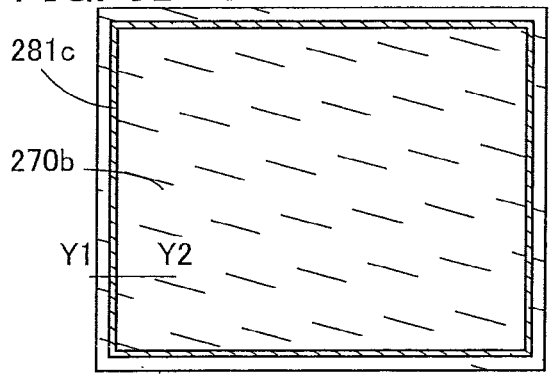
Figures 2, 3D:
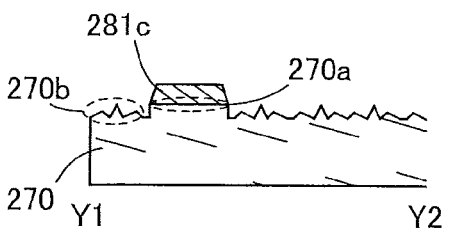

In the fourth step, the one surface of the sealing substrate 270 is selectively etched using the residue 281d as a resist mask (see FIGS. 3D-1 and 3D-2).

The residue 281d containing nickel is not easily etched. Thus, the residue 281d functions as a resist mask for the surface of the sealing substrate 270 under the residue 281d. In addition, the residue 281d is distributed non-uniformly over the surface of the sealing substrate 270. As a result, irregular projections and depressions 270b can be formed over the surface of the sealing substrate 270.

The state of a surface 270a of the sealing substrate 270 that the island-shaped film 281c overlaps is maintained in the fourth step. As a result, the surface 270a that is flat and smooth and is adjacent to the projections and depressions 270b and the island-shaped film 281c that overlaps the surface 270a can be formed.

The method for forming projections and depressions in this embodiment includes a step of forming a film containing metals having different etching rates over a surface; a step of heating the film so that the metal having a lower etching rate segregates; a step of selectively etching the metal having a higher etching rate; and a step of selectively etching the surface using a residue containing the metal having a lower etching rate as a resist mask. This method can form projections and depressions over one surface. As a result, a novel method for foaming projections and depressions can be provided.

<Modified Example: Method for Forming Sealing Substrate>

As a modified example of this embodiment, a method for forming a sealing substrate having projections and depressions is described with reference to FIGS. 4A-1, 4A-2, 4B-1, 4B-2, 4C-1, and 4C-2.

Figures 1, 4A:
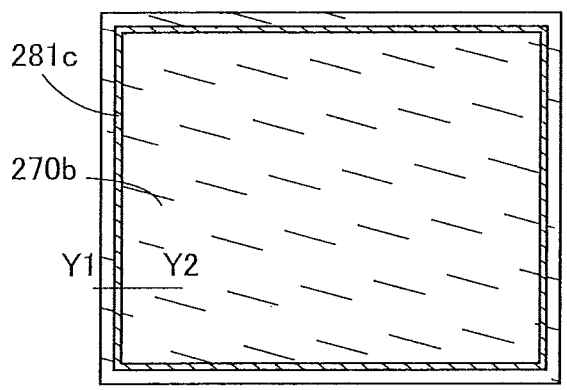
Figures 2, 4A:
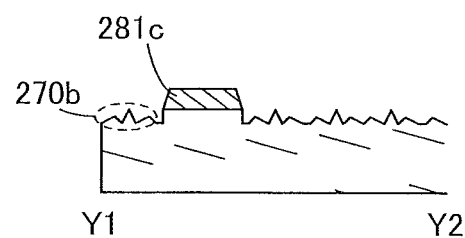
Figures 1, 4B:
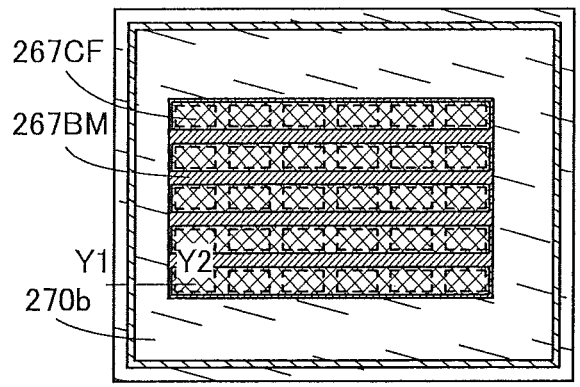
Figures 2, 4B:
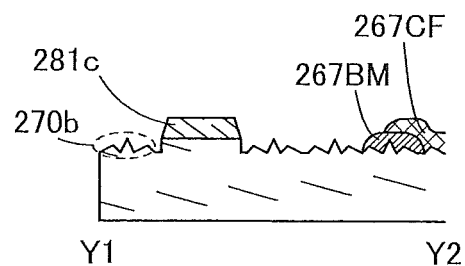
Figures 1, 4C:
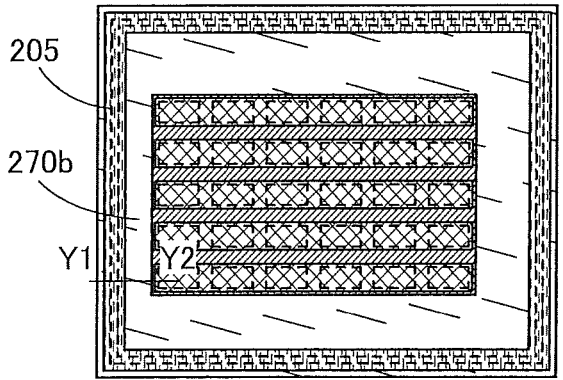
Figures 2, 4C:
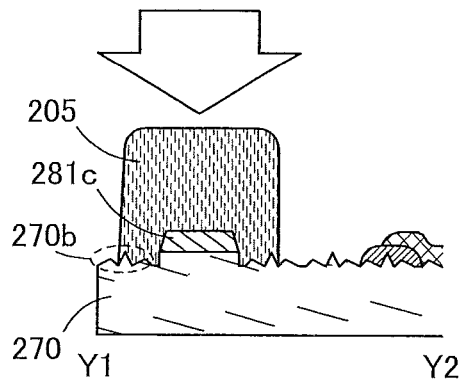

FIGS. 4A-1 to 4C-1 are each a top view of a sealing substrate for illustrating the method for forming a sealing substrate having projections and depressions for the sealing structure in which a light-emitting element is sealed, which is the modified example of this embodiment. In addition, FIGS. 4A-2, 4B-2, and 4C-2 are cross-sectional views of the sealing substrate taken along the section line Y1-Y2 in FIGS. 4A-1, 4B-1, and 4C-1, respectively.

In the modified example of this embodiment, a method similar to the method described above is used. Therefore, the description given above is referred to for the steps up to and including the fourth step is used, and the fifth and subsequent steps are described below. Note that FIGS. 4A-1 and 4A-2 illustrate a structure of the sealing substrate after the fourth step.

The film containing aluminum and nickel is selectively etched to form the island-shaped film 281c having a closed contour. Specifically, the island-shaped film 281c is formed using the resist mask PR in a position where a sealant formed later overlaps the island-shaped film 281c.

<<Fifth Step>>

In the fifth step, a light-shielding layer 267BM and a coloring layer 267CF are formed (see FIGS. 4B-1 and 4B-2).

Note that the light-shielding layer 267BM and the coloring layer 267CF can be formed by a known technique as well as a coating method, a printing method, an ink-jet method, photolithography, or the like.

<<Sixth Step>>

In the sixth step, a sealant 205 is formed (see FIGS. 4C-1 and 4C-2).

The sealant 205 can be formed by a known technique as well as a coating method, a printing method, a dispensing method, or the like.

A method for forming the sealant 205 containing low melting point glass by a screen printing method is described as an example.

A paste containing low melting point glass powders, a resin, and a solvent is printed so as to overlap the film 281c by a screen printing method. Specifically, the paste is printed so that the sealant 205 has a closed contour.

Next, the printed paste is irradiated with a laser beam, for example, in a direction indicated by an arrow to be locally heated. This can reduce the amount of resin and/or solvent remaining in the paste. In addition, the low melting point glass powders can be welded together and can keep the state formed by the screen printing method.

Note that a laser beam can locally heat the paste. This allows the light-shielding layer 267BM and the coloring layer 267CF that are easily damaged by heating to be formed over the sealing substrate 270 in advance. Note that since the projections and depressions 270b are formed, the light-shielding layer 267BM and/or the coloring layer 267CF are/is favorably in close contact with the sealing substrate 270.

This embodiment can be combined as appropriate with any of the other embodiments in this specification.

(Embodiment 3)

In this embodiment, a structure of a sealing structure of one embodiment of the present invention is described with reference to FIGS. 5A to 5D. Specifically, a structure of a sealing structure in which a light-emitting element is sealed as a sealed structure in a region surrounded by a substrate, a sealing substrate, and a sealant is described.

Figure 5A:
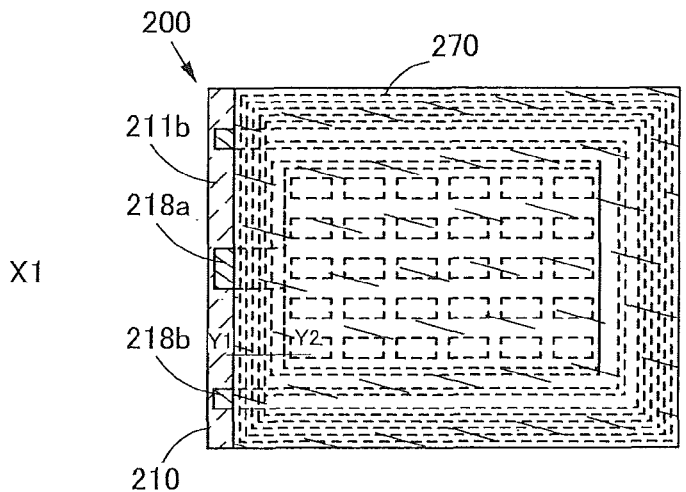
FIGS. 5A to 5D illustrate sealing structures of an embodiment.
Figure 5B:
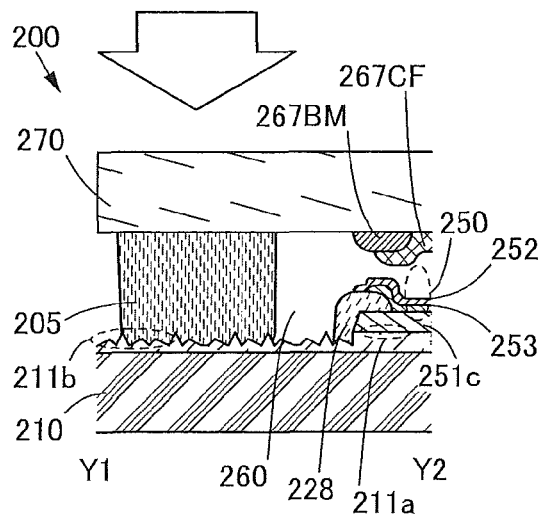

FIG. 5A is a top view of a substrate for illustrating the structure of the sealing structure of one embodiment of the present invention. FIG. 5B is a cross-sectional view of the sealing structure taken along the section line Y1-Y2 in FIG. 5A.

<Sealing Structure>

The sealing structure of one embodiment of the present invention includes the substrate 210, the sealing substrate 270 facing one surface of the substrate 210, the sealant 205 for bonding the substrate 210 and the sealing substrate 270, and a sealed structure (e.g., the light-emitting element 250) sealed in a region 260 surrounded by the substrate 210, the sealing substrate 270, and the sealant 205 (see FIGS. 5A and 5B).

The one surface of the substrate 210 has projections and depressions 211b, a surface 211a that is adjacent to the projections and depressions 211b and is flatter and smoother than the projections and depressions 211b, and an island-shaped film 251c that overlaps the flat and smooth surface 211a.

In addition, the sealant 205 is in contact with the projections and depressions 211b.

In the sealing structure 200 of one embodiment of the present invention, the sealant 205 that is in contact with the projections and depressions 211b adjacent to the film 251c bonds the sealing substrate 270 and the substrate 210. Thus, the area of the sealant that is in contact with the substrate can be increased, resulting in the increased bonding strength. Consequently, a novel sealing structure can be provided.

Note that the light-emitting element 250 includes the film 251c having conductivity as a lower electrode and the upper electrode 252 overlapping the lower electrode, and the layer 253 containing a light-emitting organic compound between the lower electrode and the upper electrode.

The substrate 210 that is provided with the light-emitting element 250 can be referred to as a substrate with a light-emitting element. The substrate with the light-emitting element can be formed by, for example, the method described in Embodiment 1.

The sealing substrate 270 is provided with the coloring layer 267CF in a position overlapping the light-emitting element 250 and the light-shielding layer 267BM surrounding the coloring layer 267CF when seen from the above.

Individual components included in the sealing structure of one embodiment of the present invention are described below.

<<Projections and Depressions>>

The peak-to-valley (P-V) value, which means the difference between the maximum peak height and the maximum valley depth, of the projections and depressions 211b provided over the one surface of the substrate 210 is greater than or equal to 50 nm and less than or equal to 200 nm.

The P-V value of the surface 211a that is flatter than the projections and depressions 211b provided over the one surface of the substrate 210 is greater than 0 nm and less than or equal to 20 nm.

<<Sealant>>

A material that can bond the substrate 210 and the sealing substrate 270 can be used for the sealant 205.

A material whose impurity (e.g., water vapor) permeability is low is preferably used for the sealant 205; for example, the material preferably has a permeability per length of 0.1 mm in a direction in which the sealing structure is surrounded is less than 100 g/m$^2$/24 hr.

For example, an inorganic material or an organic material can be used as the material that can be used for the sealant 205. Specific examples of the inorganic material are solder and glass that have a relatively low melting point (higher than or equal to 300° C. and lower than or equal to 700° C.). As the organic material, a resin such as polyester, polyolefin, polyamide, polyimide, polycarbonate, an epoxy resin, or an acrylic resin, or a complex of a plurality of kinds of resin selected from these resins can be used. Alternatively, two or more sealants formed using materials selected from the above materials may be used for double or multiple sealing.

The low melting point glass that can be used for the sealant 205 preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass. A material absorbing light may be added to the low melting point glass.

In the case where the sealant 205 containing low melting point glass is used, the low melting point glass is melted, and the substrate 210 and the sealing substrate 270 are welded together using the melted low melting point glass. Note that a local heating apparatus (e.g., a device generating an energy beam, specifically a semiconductor laser) is preferably used, in which case damage to the sealed structure due to heating can be reduced.

In the case where a curing resin is used, a thermal curing resin, a light curing resin, or the like can be used. The light curing resin can be cured in a short time. The thermal curing resin can be used for a portion that cannot be irradiated with light such as ultraviolet light.

<<Substrate or Sealing Substrate>>

The substrate 210 or the sealing substrate 270 has heat resistance high enough to withstand the manufacturing process and are not particularly limited in thickness and size as long as they can be applied to a manufacturing apparatus. In addition, the substrate 210 or the sealing substrate 270 may have a single-layer structure or a layered structure including two or more layers. For example, a functional layer may be formed over a surface of a substrate with excellent heat resistance and the formed functional layer may be transferred to a flexible substrate. This method allows a functional layer for which heat resistance is required in manufacture to be formed over a substrate with poor heat resistance.

For the substrate 210 or the substrate 270, a material that can prevent a phenomenon in which unwanted impurities are diffused into the sealed structure can be used favorably. For example, it is preferable to use a material with gas barrier properties in which the water vapor permeability is lower than or equal to $10^{-5}$ g/m$^2$·day, preferably lower than or equal to $10^{-6}$ g/m$^2$·day.

Examples of the material that can be used for the substrate 210 or the sealing substrate 270 include glass, ceramics, a metal, an inorganic material, and a resin in a plate-like shape or a film-like shape, and a stack including some of these materials.

<Modified example: sealing structure>

Figure 5C:
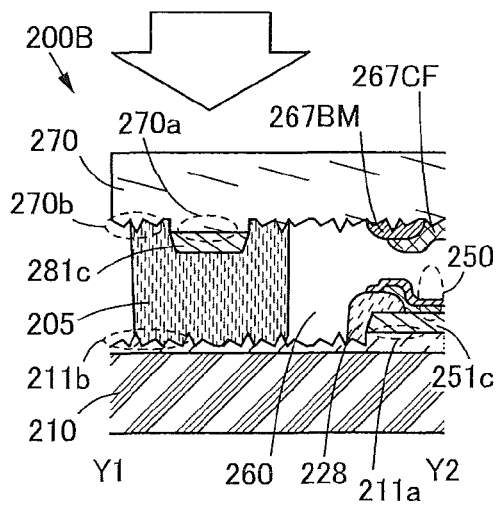
Figure 5D:
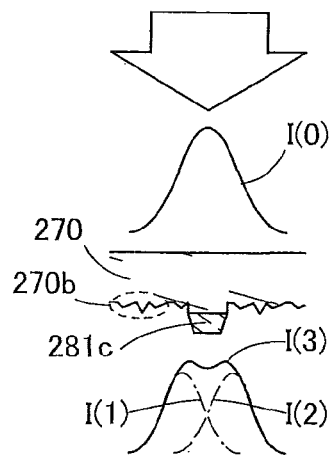

As a modified example of this embodiment, a structure of a sealing structure 200B including a sealing substrate having projections and depressions is described with reference to FIGS. 5C and 5D. Note that FIG. 5C is a cross-sectional view of the sealing structure taken along the section line Y1-Y2 in FIG. 5A. FIG. 5D is a conceptual diagram showing a method of correcting the intensity distribution of a laser beam, the central part of which has too high intensity, with the use of an island-shaped film that reflects light.

In the sealing structure 200B described as an example in the modified example of this embodiment, projections and depressions 270b, a surface 270a that is adjacent to the projections and depressions 270b and flatter and smoother than the projections and depressions 270b, and an island-shaped film 281c that reflects light and is overlapped with the flat and smooth surface 270a are provided for one surface of the sealing substrate 270.

The sealant 205 contains glass whose melting point is higher than or equal to 300° C. and lower than or equal to 700° C. and is in contact with the film 281c.

In the sealing structure 200B, the sealant 205 containing the low melting point glass is in contact with the projections and depressions 270b of the sealing substrate 270 that are adjacent to the film 281c that reflects light, so that the sealing substrate 270 and the substrate 210 are bonded to each other. Thus, the sealant 205 is firmly welded to the projections and depressions 270b that are adjacent to the film 281c. In addition, the area of the film 281c that overlaps the sealant 205 can be adjusted. As a result, a novel sealing structure can be provided.

Note that the sealing substrate 270 is provided with the light-shielding layer 267BM having an opening overlapping the light-emitting element 250 and the coloring layer 267CF overlapping the light-emitting element 250.

Individual components included in the sealing structure of one embodiment of the present invention are described below.

<<Island-shaped Film>>

The island-shaped film 281c can adjust the area of the sealant 205 that is in contact with the projections and depressions 270b. The island-shaped film 281c that reflects light can adjust the intensity and/or distribution of light emitted to the sealant 205.

The sealant 205 containing glass whose melting point is higher than or equal to 300° C. and lower than or equal to 700° C. is provided so as to be overlapped with the island-shaped light-reflecting film 281c. With such a structure, the distribution of light emitted to the sealant 205 for local heating can be adjusted. Specifically, the intensity distribution of a laser beam is corrected to prevent defective melting of the sealant 205.

FIG. 5D schematically shows an example of intensity distribution I(0) of a laser beam, the central part of which has too high intensity. The island-shaped light-reflecting film 281c is provided along a region of the sealing substrate 270 that is scanned by the central part of the laser beam.

The central part of the laser beam is reflected by the island-shaped 281c that reflects light. The other parts of the laser beam reach the sealant 205 from the left and the right sides of the island-shaped film 281c. Thus, the intensity distribution of the laser beam reaching the sealant 205 can be corrected to be intensity distribution I(3) in which intensity distribution I(1) and intensity distribution I(2) overlap each other. Consequently, overheating of the sealant 205 by the vicinity of the central part of the laser beam can be prevented, resulting in favorable sealing.

As a result, a phenomenon in which the sealant 205 is melted non-uniformly can be prevented.

This embodiment can be combined as appropriate with any of the other embodiments in this specification.

(Embodiment 4)

In this embodiment, a structure of a light-emitting device of one embodiment of the present invention is described with reference to FIGS. 6A and 6B. Specifically, a structure of a light-emitting device in which a light-emitting element is sealed in a region surrounded by a substrate, a sealing substrate, and a sealant is described.

Figure 6A:
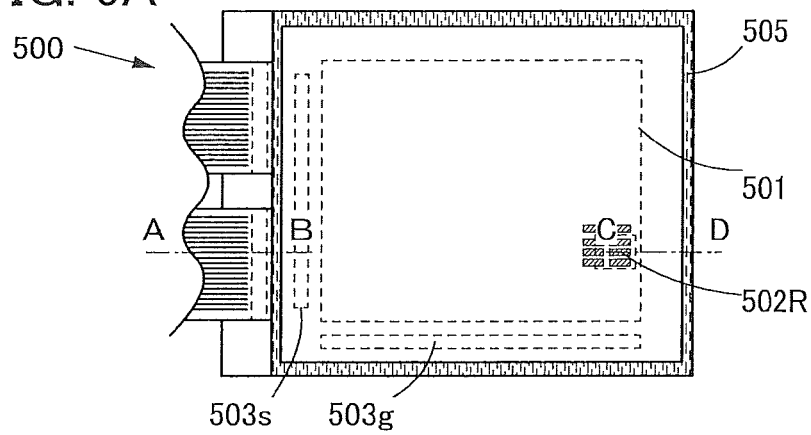
FIGS. 6A and 6B illustrate a light-emitting device of an embodiment.
Figure 6B:
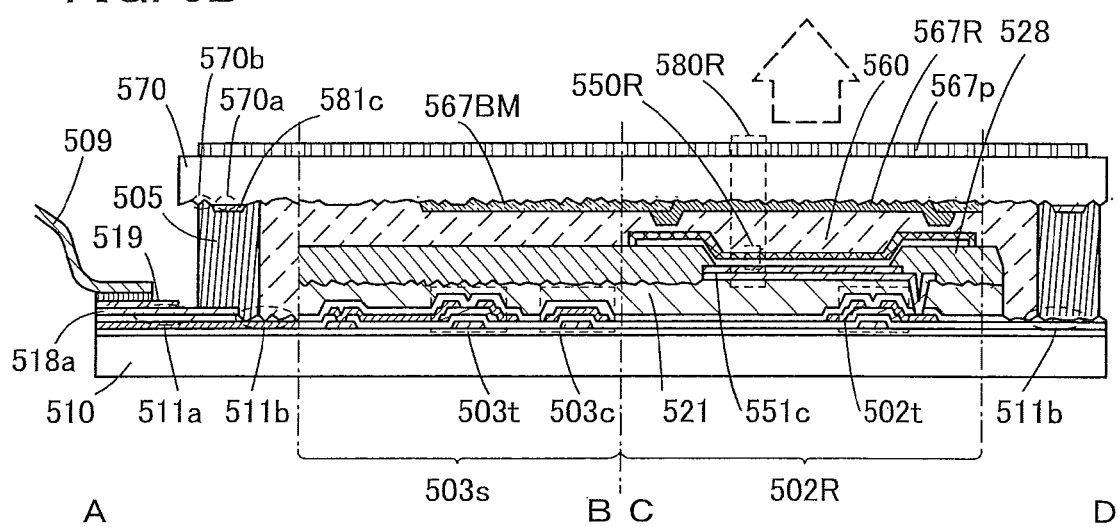

FIG. 6A is a top view illustrating the structure of the light-emitting device of one embodiment of the present invention. FIG. 6B is a cross-sectional view of the light-emitting device taken along the section lines A-B and C-D.

<Light-emitting Device>

A light-emitting device 500 of one embodiment of the present invention includes a substrate 510, a sealing substrate 570 facing one surface of the substrate 510, a sealant 505 for bonding the substrate 510 and the sealing substrate 570, and a light-emitting element 550R sealed in a region surrounded by the substrate 510, the sealing substrate 570, and the sealant 505.

The one surface of the substrate 510 has projections and depressions 511b, a surface 511a that is adjacent to the projections and depressions 511b and is flatter and smoother than the projections and depressions 511b, and an island-shaped conductive film 518a that overlaps the surface 511a that is flat and smooth.

The light-emitting element 550R is electrically connected to the conductive film 518a.

The sealant 505 is in contact with the projections and depressions 511b.

The light-emitting device 500 described as an example in this embodiment includes the light-emitting element 550R, the conductive film 518a that is electrically connected to the light-emitting element 550R, and the sealant 505 that is in contact with the projections and depressions 511b adjacent to the conductive film 518a. The light-emitting element 550R is sealed in a region surrounded by the sealant 505, the substrate 510, and the sealing substrate 570. This structure enables electric power to be supplied to the light-emitting element 550R through the conductive film 518a. In addition, the area in which the sealant 505 is in contact with the substrate 510 is increased, resulting in the increased bonding strength. Consequently, a novel light-emitting device in which diffusion of impurities is suppressed can be provided.

<<Other Structures>>

The light-emitting device 500 includes the sealing substrate 570. One surface of the sealing substrate 570 has projections and depressions 570b, a surface 570a that is adjacent to the projections and depressions 570b and is flatter and smoother than the projections and depressions 570b, and an island-shaped film 581c that is overlapped with the flat and smooth surface 570a.

The light-emitting device 500 includes the sealant 505. The sealant 505 contains glass whose melting point is higher than or equal to 300° C. and lower than or equal to 700° C. and is in contact with the island-shaped film 581c.

The light-emitting device 500 includes the conductive film 518a that can supply a signal and a film 551c that supplies electric power to the light-emitting element. Projections and depressions are formed to be adjacent to the film 518a and the film 551c.

A terminal 519 is provided over the conductive film 518a. A flexible printed circuit (FPC) 509 that can supply signals such as data signals and synchronization signals is electrically connected to the terminal 519.

Note that a printed wiring board (PWB) may be attached to the FPC. The light-emitting device in this specification includes, in its category, not only a light-emitting device itself but also a light-emitting device provided with an FPC or a PWB.

<<Structure of Data Line Driver Circuit>>

The light-emitting device 500 includes a scan line driver circuit 503g and a data line driver circuit 503s. The data line driver circuit 503s includes a transistor 503t and a capacitor 503c. The data line driver circuit 503s can also be formed through the same steps and over the same substrate as the scan line driver circuit 503g and a pixel circuit.

<<Structure of Sub-pixel>>

The light-emitting device 500 includes a coloring layer 567R. The coloring layer 567R overlaps the light-emitting element 550R. With such a structure, part of light emitted from the light-emitting element 550R passes through the coloring layer 567R to be emitted to the outside of the light-emitting device 500.

The light-emitting device 500 includes a light-shielding layer 567BM. The light-shielding layer 567BM is provided so as to surround the coloring layer 567R.

Note that an optical bonding layer 560 may be placed to be in contact with the light-emitting element 550R and the coloring layer 567R. The optical bonding layer 560 has higher reflectivity than the air. This structure enables light emitted from the light-emitting element 550R to be efficiently extracted on the coloring layer 567R side.

The light-emitting element 550R, the optical bonding layer 560, and the coloring layer 567R form a light-emitting module 580R.

The light-emitting device 500 includes an anti-reflection layer 567p in a position overlapping a display region 501. As the anti-reflection layer 567p, for example, a circularly polarizing plate or the like can be used.

In addition, a sub-pixel 502R includes a pixel circuit including a transistor 502t, which can supply electric power to the light-emitting module 580R.

The light-emitting device 500 includes the light-emitting element 550R over an insulating film 521. The insulating film 521 covers the transistor 502t. Note that the insulating film 521 can be used as a layer for planarizing unevenness caused by the pixel circuit. In addition, an insulating film over which a layer that can suppress a phenomenon in which impurities are diffused to the transistor 502t or the like is stacked can be used as the insulating film 521.

The light-emitting device 500 includes, over the insulating film 521, a conductive film and a partition 528 covering an end portion of the conductive film. In addition, an opening is provided in the partition 528, and the conductive film overlapping the opening serves as a lower electrode of the light-emitting element 550R.

The light-emitting element 550R includes the lower electrode, an upper electrode overlapping the lower electrode, and a layer containing a light-emitting organic compound between the lower electrode and the upper electrode.

The structure of the light-emitting element that can be used for the light-emitting device of one embodiment of the present invention is described in detail in Embodiment 5.

This embodiment can be combined as appropriate with any of the other embodiments in this specification.

(Embodiment 5)

In this embodiment, a structure of a light-emitting element that can be used for the light-emitting device of one embodiment of the present invention is described. Specifically, an example of a light-emitting element in which a layer containing a light-emitting organic compound is interposed between a pair of electrodes is described with reference to FIGS. 7A to 7E.

The light-emitting element described in this embodiment as an example includes a lower electrode, an upper electrode, and a layer containing a light-emitting organic compound (hereinafter referred to as an EL layer) provided between the lower electrode and the upper electrode. The EL layer may be a single layer or a stacked layer of a plurality of layers as long as one layer contains a light-emitting organic compound. One of the lower and upper electrodes functions as an anode, and the other functions as a cathode. The EL layer is provided between the lower electrode and the upper electrode, and a structure of the EL layer may be determined as appropriate in accordance with materials of the lower electrode and the upper electrode. Examples of the structure of the light-emitting element are described below; needless to say, the structure of the light-emitting element is not limited to the examples.

<Structure Example 1 of Light-emitting Element>

Figure 7A:
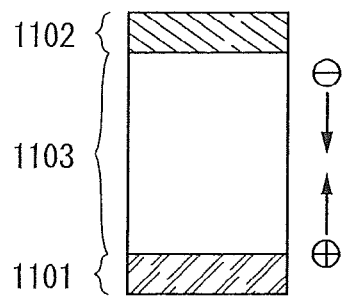
FIGS. 7A to 7E each illustrate a light-emitting element of an embodiment.

An example of the structure of the light-emitting element is illustrated in FIG. 7A. In the light-emitting element illustrated in FIG. 7A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer in a region where electrons and holes injected from both ends are recombined is referred to as a light-emitting layer, and a layer or a stacked body that includes one light-emitting layer is referred to as a light-emitting unit. Therefore, it can be said that the structure example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 7B:
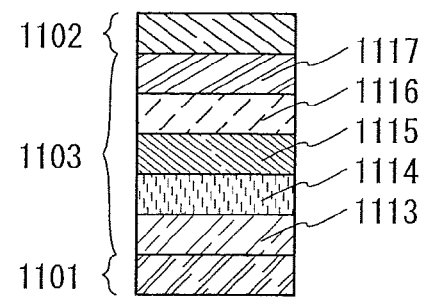

An example of a specific structure of the light-emitting unit 1103 is illustrated in FIG. 7B. In the light-emitting unit 1103 illustrated in FIG. 7B, a hole-injection layer 1113, a hole-transport layer 1114, a light-emitting layer 1115, an electron-transport layer 1116, and an electron-injection layer 1117 are stacked in this order from the anode 1101 side.

<Structure Example 2 of Light-emitting Element>

Figure 7C:
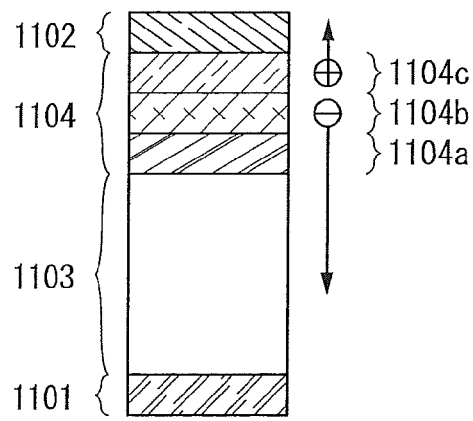

Another example of the structure of the light-emitting element is illustrated in FIG. 7C. In the light-emitting element illustrated in FIG. 7C, an EL layer including the light-emitting unit 1103 is provided between the anode 1101 and the cathode 1102. Further, an interlayer 1104 is provided between the cathode 1102 and the light-emitting unit 1103. Note that a structure similar to that of the light-emitting unit in the structure example 1 of the light-emitting element, which is described above, can be applied to the light-emitting unit 1103 in the structure example 2 of the light-emitting element and that the description of the structure example 1 of the light-emitting element can be referred to for the details.

The interlayer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The behaviors of electrons and holes in the interlayer 1104 are described. When voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can lower a barrier against electron injection into the light-emitting unit 1103, so that the efficiency of the electron injection into the light-emitting unit 1103 is increased. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance included in the first charge generation region 1104c and the substance included in the electron-injection buffer 1104a react with each other at the interface therebetween and the functions of the first charge generation region 1104c and the electron-injection buffer 1104a are impaired.

The range of choices of materials that can be used for the cathode in the structure example 2 of the light-emitting element is wider than that of materials that can be used for the cathode in the structure example 1 of the light-emitting element. This is because the cathode in the structure example 2 can be formed using a material having a relatively high work function as long as the cathode receives holes generated in the interlayer.

<Structure Example 3 of Light-emitting Element>

Figure 7D:
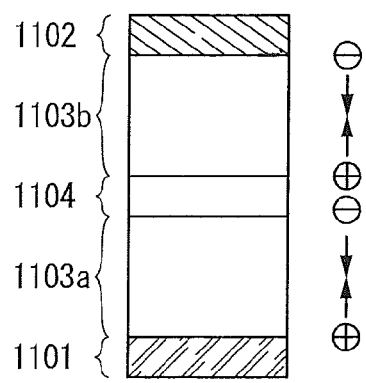
Figure 7E:
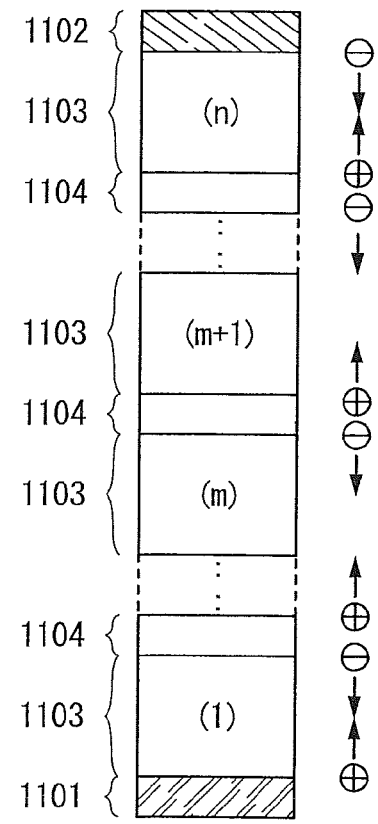

Another example of the structure of the light-emitting element is illustrated in FIG. 7D. In the light-emitting element illustrated in FIG. 7D, an EL layer including two light-emitting units is provided between the anode 1101 and the cathode 1102. Furthermore, the interlayer 1104 is provided between a first light-emitting unit 1103a and a second light-emitting unit 1103b.

Note that the number of the light-emitting units provided between the anode and the cathode is not limited to two. A light-emitting element illustrated in FIG. 7E has what is called a tandem structure, that is, a structure in which a plurality of light-emitting units 1103 are stacked. Note that in the case where n (n is a natural number greater than or equal to 2) light-emitting units 1103 are provided between the anode and the cathode, the interlayer 1104 is provided between an m-th (m is a natural number greater than or equal to 1 and less than or equal to n−1) light-emitting unit and an (m+1)-th light-emitting unit.

Note that a structure similar to that in the structure example 1 of the light-emitting element can be applied to the light-emitting unit 1103 in the structure example 3 of the light-emitting element; a structure similar to that in the structure example 2 of the light-emitting element can be applied to the interlayer 1104 in the structure example 3 of the light-emitting element. Therefore, the description of the structure example 1 of the light-emitting element or the description of the structure example 2 of the light-emitting element can be referred to for the details.

The behaviors of electrons and holes in the interlayer 1104 are described. When voltage higher than the threshold voltage of the light-emitting element is applied between the anode 1101 and the cathode 1102, holes and electrons are generated in the interlayer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the interlayer 1104 cause light emission in the respective light-emitting units.

Note that the light-emitting units can be provided in contact with each other when these light-emitting units allow the same structure as the interlayer to be formed therebetween. Specifically, when one surface of the light-emitting unit is provided with a charge generation region, the charge generation region functions as a first charge generation region of the interlayer; thus, the light-emitting units can be provided in contact with each other.

The structure examples 1 to 3 of the light-emitting element can be implemented in combination. For example, an interlayer may be provided between the cathode and the light-emitting unit in the structure example 3 of the light-emitting element.

<Structure Including Microresonator>

Note that a microresonator (microcavity) composed of a reflective film and a semi-transmissive and semi-reflective film overlapping the reflective film may be placed so as to sandwich a light-emitting element. By placing the light-emitting element between the microresonators, interference of light emitted from the light-emitting element occurs, so that light of a specific color can be efficiently extracted.

Note that the semi-transmissive and semi-reflective film in this specification refers to a film transmitting and reflecting part of incident light. The semi-transmissive and semi-reflective film used for the microresonator preferably absorbs less light.

The wavelength of extracted light depends on the distance between the reflective film and the semi-transmissive and semi-reflective film. An optical adjustment layer for adjusting the distance between the reflective film and the semi-transmissive and semi-reflective film may be provided in the light-emitting element in some cases.

A conductive film having properties of transmitting visible light or an EL layer can be used as a material that can be used for the optical adjustment layer.

For example, a stacked-layer film including a light-transmitting conductive film and a reflective film, or a stacked-layer film including a light-transmitting conductive film and a semi-transmissive and semi-reflective film can be used as a lower electrode or an upper electrode which also serves as the optical adjustment layer.

An interlayer whose thickness is adjusted may be used as the optical adjustment layer. Alternatively, a region whose thickness is adjusted and which contains a substance having a high hole-transport property and an acceptor substance with respect to the substance having a high hole-transport property can be used for the optical adjustment layer. The electric resistance of this component is lower than that of other components included in the EL layer. Thus, even if the thickness is increased for optical adjustment, this structure is preferable because an increase in driving voltage of a light-emitting element can be suppressed.

<Material for Light-emitting Element>

Next, specific materials that can be used for the light-emitting elements having the above structures are described; materials for the anode, the cathode, and the EL layer are described in this order.

<<1. Material for Anode>>

The anode 1101 is formed with a single-layer structure or a stacked structure using any of a metal, an alloy, an electrically conductive compound, and a mixture thereof which have conductivity. In particular, a structure is preferred in which a material having a high work function (specifically, 4.0 eV or higher) is in contact with the EL layer.

Examples of the metal or the alloy material include gold (Au), platinum (Pt), nickel (Ni), tungsten (W), chromium (Cr), molybdenum (Mo), iron (Fe), cobalt (Co), copper (Cu), palladium (Pd), and titanium (Ti), and an alloy thereof.

Examples of the electrically conductive compound include an oxide of a metal material, a nitride of a metal material, and a conductive high molecule.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Specific examples of the oxide of a metal material further include molybdenum oxide, vanadium oxide, ruthenium oxide, tungsten oxide, manganese oxide, and titanium oxide.

A film of the oxide of a metal material is usually formed by a sputtering method, but may be formed by application of a sol-gel method or the like.

Specific examples of the nitride of a metal material include titanium nitride and tantalum nitride.

Specific examples of the conductive high molecule include poly(3,4-ethylenedioxythiophene)/poly(styrenesulfonic acid) (PEDOT/PSS) and polyaniline/poly(styrenesulfonic acid) (PAni/PSS).

Note that in the case where the second charge generation region is provided in contact with the anode 1101, a variety of electrically conductive materials can be used for the anode 1101 regardless of their work functions. Specifically, besides a material having a high work function, a material having a low work function can also be used for the anode 1101. Materials that can be used for the second charge generation region and the first charge generation region are described later.

<<2. Material for Cathode>>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For example, when one of the cathode 1102 and the anode 1101 is formed using a conductive film that transmits visible light and the other is formed using a conductive film that reflects visible light, a light-emitting element that emits light from one side can be formed. Alternatively, when both the cathode 1102 and the anode 1101 are formed using conductive films that transmit visible light, a light-emitting element that emits light from both sides can be formed.

Examples of the electrically conductive film that transmits visible light include a film of indium tin oxide, a film of indium tin oxide containing silicon or silicon oxide, a film of indium tin oxide containing titanium, a film of indium titanium oxide, a film of indium tungsten oxide, a film of indium zinc oxide, and a film of indium zinc oxide containing tungsten. In addition, a metal thin film having a thickness small enough to transmit light (preferably, approximately 5 nm to 30 nm) can be used.

For the conductive film that reflects visible light, for example, metal may be used; specifically, a metal material such as silver, aluminum, platinum, gold, or copper, or an alloy material containing any of these may be used. Examples of the alloy containing silver include a silver-neodymium alloy and a magnesium-silver alloy. Examples of the alloy of aluminum include an aluminum-nickel-lanthanum alloy, an aluminum-titanium alloy, and an aluminum-neodymium alloy.

<<3. Material for EL Layer>>

Specific examples of materials for the layers included in the light-emitting unit 1103 are given below.

The hole-injection layer is a layer containing a substance having a high hole-injection property. As the substance having a high hole-injection property, for example, a molybdenum oxide, a vanadium oxide, a ruthenium oxide, a tungsten oxide, a manganese oxide, or the like can be used. Alternatively, the hole-injection layer can be formed using a phthalocyanine compound such as phthalocyanine ($H_2Pc$) or copper phthalocyanine (CuPc), a high molecular compound such as poly(3,4-ethylenedioxythiophene)/poly(styrenesulfonic acid) (PEDOT/PSS), or the like.

Note that the hole-injection layer may be formed using the second charge generation region. When the second charge generation region is used for the hole-injection layer, a variety of conductive materials can be used for the anode 1101 regardless of their work functions as described above. Materials for the second charge generation region are described later together with the materials for the first charge generation region.

<<3.1. Hole-transport Layer>>

The hole-transport layer is a layer containing a substance having a high hole-transport property. The hole-transport layer may have a stacked layer of two or more layers containing a substance having a high hole-transport property without limitation to a single layer. A substance having a hole-transport property higher than an electron-transport property is used. In particular, a substance having a hole mobility of $10^{-6}$ cm$^2$/Vs or higher is preferably used, in which case the driving voltage of the light-emitting element can be reduced.

As examples of the substance having a high hole-transport property, an aromatic amine compound such as 4,4'-bis[N-(1-naphthyl)-N-phenylamino]biphenyl (abbreviation: NPB or α-NPD) and a carbazole derivative such as 9-[4-(10-phenyl-9-anthracenyl)phenyl]-9H-carbazole (abbreviation: CzPA) can be given. A high molecular compound (e.g., poly(N-vinylcarbazole) (abbreviation: PVK)), or the like can also be used.

<<3.2. Light-emitting Layer>>

The light-emitting layer is a layer containing a light-emitting substance. The light-emitting layer may have a stacked layer of two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

As the light-emitting substance, a fluorescent compound (e.g., coumarin 545T), a phosphorescent compound (e.g., tris(2-phenylpyridinato)iridium(III) (abbreviation: Ir(ppy)$_3$)), or the like can be used.

The light-emitting substance is preferably dispersed in a host material. The host material preferably has higher excitation energy than the light-emitting substance.

As the material that can be used as the host material, the above-described substance having a high hole-transport property (e.g., an aromatic amine compound, a carbazole derivative, and a high molecular compound), a substance having a high electron-transport property (e.g., a metal complex having a quinoline skeleton or a benzoquinoline skeleton and a metal complex having an oxazole-based ligand or a thiazole-based ligand), which are described later, or the like can be used.

<<3.3. Electron-transport Layer>>

The electron-transport layer is a layer containing a substance having a high electron-transport property. The electron-transport layer may have a stacked layer of two or more layers containing a substance having a high electron-transport property without limitation to a single layer. A substance having an electron-transport property higher than a hole-transport property is used. In particular, a substance having an electron mobility of $10^{-6}$ cm$^2$/Vs or higher is preferably used, in which case the driving voltage of the light-emitting element can be reduced.

Examples of the substance having a high electron-transport property include a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: Zn(BOX)$_2$)), and other compounds (e.g., bathophenanthroline (abbreviation: BPhen)). A high molecular compound (e.g., poly[(9,9-dihexylfluorene-2,7-diyl)-co-(pyridine-3,5-diyl)] (abbreviation: PF-Py)) can also be used.

<<3.4. Electron-injection Layer>>

The electron-injection layer is a layer containing a substance having a high electron-injection property. The electron-injection layer may have a stacked layer of two or more layers containing a substance having a high electron-injection property without limitation to a single layer. The electron-injection layer is preferably provided, in which case the efficiency of electron injection from the cathode 1102 can be increased, so that the driving voltage of the light-emitting element can be reduced.

Examples of the substance having a high electron-injection property include an alkali metal (e.g., lithium (Li), or cesium (Cs)), an alkaline earth metal (e.g., calcium (Ca)), a compound of such a metal (e.g., oxide (specifically, lithium oxide, or the like), a carbonate (specifically, lithium carbonate, cesium carbonate, or the like), and a halide (specifically, lithium fluoride (LiF), cesium fluoride (CsF), or calcium fluoride (CaF$_2$)).

Alternatively, the layer containing a high electron-injection property may be a layer containing a substance with a high electron-transport property and a donor substance (specifically, a layer made of Alq containing magnesium (Mg)). Note that the mass ratio of the added donor substance to the substance having a high electron-transport property is preferably 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal.

<<3.5. Charge Generation Region>>

The first charge generation region 1104c and the second charge generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing an acceptor substance is in contact with the anode 1101.

Note that the acceptor substance is preferably added to the charge generation region so that the mass ratio of the acceptor substance to the substance having a high hole-transport property is from 0.1:1 to 4.0:1.

Examples of the acceptor substance that is used for the charge generation region include a transition metal oxide and an oxide of a metal belonging to any of Groups 4 to 8 of the periodic table. Specifically, molybdenum oxide is particularly preferable. Note that molybdenum oxide has a low hygroscopic property.

As the substance having a high hole-transport property that is used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferably used. Note that any substance other than the above substances may be used as long as the hole-transport property thereof is higher than the electron-transport property thereof.

<<Electron-relay Layer>>

The electron-relay layer 1104b is a layer that can immediately receive electrons extracted by the acceptor substance in the first charge generation region 1104c. Therefore, the electron-relay layer 1104b is a layer containing a substance having a high electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, the LUMO level of the electron-relay layer 1104b is preferably approximately greater than or equal to −5.0 eV and less than or equal to −3.0 eV.

Examples of the substance used for the electron-relay layer 1104b include a perylene derivative (e.g., 3,4,9,10-perylenetetracarboxylic dianhydride (abbreviation: PTCDA)) and a nitrogen-containing condensed aromatic compound (pyrazino[2,3-f][1,10]phenanthroline-2,3-dicarbonitrile (abbreviation: PPDN)).

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

<<Electron-injection Buffer>>

An electron-injection buffer is a layer containing a substance having a high electron-injection property. The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

Examples of the substance having a high electron-injection property include an alkali metal, an alkali earth metal, a rare earth metal, and a compound of these metals.

Alternatively, the layer containing a substance having a high electron-injection property may be a layer containing a substance having a high electron-transport property and a donor substance.

<Method for Manufacturing Light-emitting Element>

A method for manufacturing the light-emitting element is described. Over the lower electrode, the layers described above are combined as appropriate to form the EL layer. Any of a variety of methods (e.g., a dry process or a wet process) can be used for the EL layer depending on the material for the EL layer. For example, a vacuum evaporation method, a transfer method, a printing method, an inkjet method, a spin coating method, or the like may be selected. Note that a different formation method may be employed for each layer. The upper electrode is formed over the EL layer. In the above manner, the light-emitting element is manufactured.

The light-emitting element described in this embodiment can be manufactured by combining the above substances. Light emission from the above light-emitting substance can be obtained with this light-emitting element, and the emission color can be selected by changing the types of the light-emitting substances.

When a plurality of light-emitting substances emitting light of different colors are used, the width of the emission spectrum can be expanded, whereby, for example, white light emission can be obtained. In order to obtain white light emission, for example, a structure may be employed in which at least two layers containing light-emitting substances are provided so that light of complementary colors is emitted. Specific examples of complementary colors are a combination of blue and yellow and a combination of blue-green and red.

Furthermore in order to obtain white light emission with an excellent color rendering property, an emission spectrum preferably spreads through the entire visible light region. For example, a light-emitting element may include layers emitting light of blue, green, and red.

This embodiment can be combined as appropriate with any of the other embodiments in this specification.

(Embodiment 6)

In this embodiment, electronic devices of one embodiment of the present invention are described with reference to FIGS. 8A to 8F.

The electronic devices of one embodiment of the present invention each include a display portion including a light-emitting device of one embodiment of the present invention and can display an image on the display portion. For example, video data broadcasted or distributed or video data stored in a data storage medium can be displayed. In addition, data processed by a data processing device can be displayed. In addition, an image used for operation of a control panel or the like can be displayed.

Examples of the electronic device displaying video data include a television device and a digital photo frame.

Examples of the data processing device include a computer, a digital camera, a digital video camera, and a portable information terminal.

Examples of the electronic device include a watch, a mobile phone, a portable game machine, a large-scale game machine (e.g., a pachinko machine), and an audio reproducing device.

<Television Device>

Figure 8A:
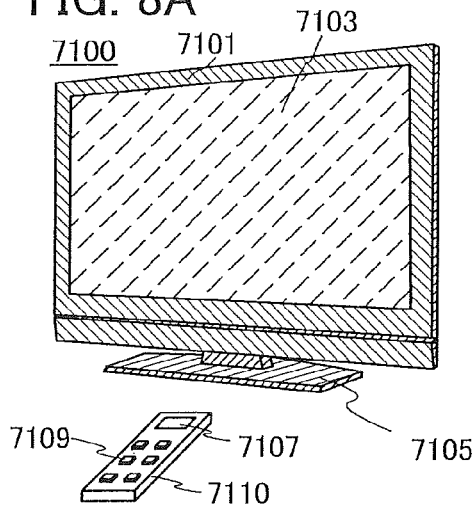
FIGS. 8A to 8F illustrate electronic devices according to an embodiment.

A television device 7100 includes a display portion 7103 incorporated in a housing 7101 supported by a stand 7105 (see FIG. 8A). In addition, the television device 7100 includes the display portion 7103 including the light-emitting device of one embodiment of the present invention and can display an image.

A remote controller 7110 can control the television device 7100. With the remote controller 7110, for example, video data displayed on the display portion 7103 can be switched, and volume can be adjusted.

The remote controller 7110 includes a data input and output panel 7107, an operation key 7109, and the like.

The display portion 7103 can display a broadcast program received by a receiver or an image supplied from a modem.

The television device 7100 may be connected to the Internet to perform two-way (e.g., between a sender and a receiver or between receivers) communication of data.

<Data Processing Device>

Figure 8B:
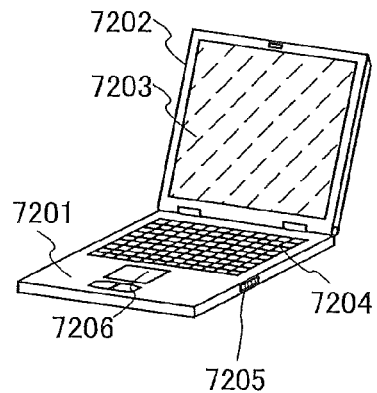

FIG. 8B illustrates a computer as an example of a data processing device. The computer includes a main body 7201, a housing 7202, a display portion 7203, a keyboard 7204, an external connection port 7205, a pointing device 7206, and the like. The display portion 7203 in the computer, which includes the light-emitting device of one embodiment of the present invention, can display images.

<Game Machine>

Figure 8C:
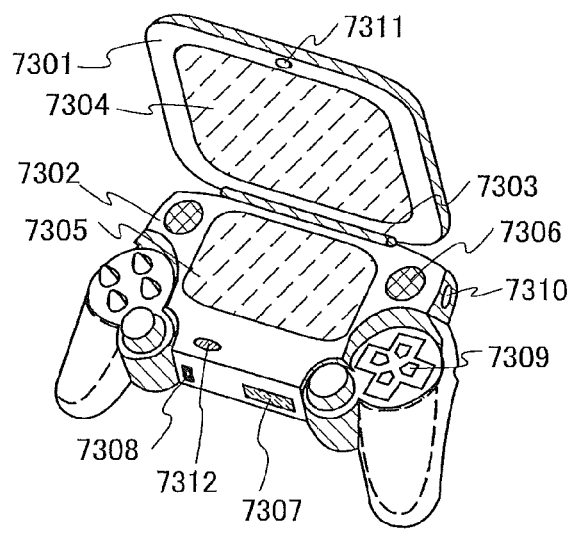

FIG. 8C illustrates an example of a portable game machine. A portable game machine illustrated as an example includes two housings, a housing 7301 and a housing 7302, which are jointed with a joint portion 7303 so that the portable game machine can be opened or folded. A first display portion 7304 is incorporated in the housing 7301 and a second display portion 7305 is incorporated in the housing 7302. The first display portion 7304 and the second display portion 7305 in the portable game machine, which include the light-emitting device of one embodiment of the present invention, can display images.

In addition, the portable game machine includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light such as infrared light, liquid, magnetism, temperature, chemical substance, sound, time, hardness, electric field, current, voltage, electric power, radiation, flow rate, humidity, gradient, oscillation, or odor), or a microphone 7312), and the like.

The portable game machine has a function of reading a program or data stored in a recording medium to display it on the first display portion 7304 and the second display portion 7305, and a function of sharing information with another portable game machine by wireless communication.

<Mobile Phone>

Figure 8D:
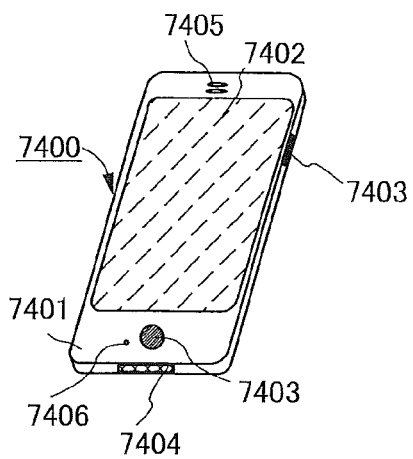

FIG. 8D illustrates an example of a mobile phone. A mobile phone 7400 is provided with a display portion 7402 incorporated in a housing 7401, an operation button 7403, an external connection port 7404, a speaker 7405, a microphone 7406, and the like. The display portion 7402 in the mobile phone 7400, which includes the light-emitting device of one embodiment of the present invention, can display images.

The display portion 7402 includes a proximity sensor. Data can be input when a finger or the like touches or approaches the proximity sensor.

When a sensing device including a sensor such as a gyroscope or an acceleration sensor for detecting inclination is provided, display on the screen of the display portion 7402 can be automatically changed in direction by determining the orientation of the mobile phone 7400 (whether the mobile phone 7400 is placed horizontally or vertically for a landscape mode or a portrait mode).

The display portion 7402 can function as a two-dimensional image sensor. In that case, images of a palm print and a fingerprint of a hand which touches the display portion 7402, images of a palm vein and a finger vein which can be taken using a backlight or a sensing light source emitting near-infrared light, and the like can be used for personal authentication, for example.

<Portable Information Terminal>

Figure 8E:
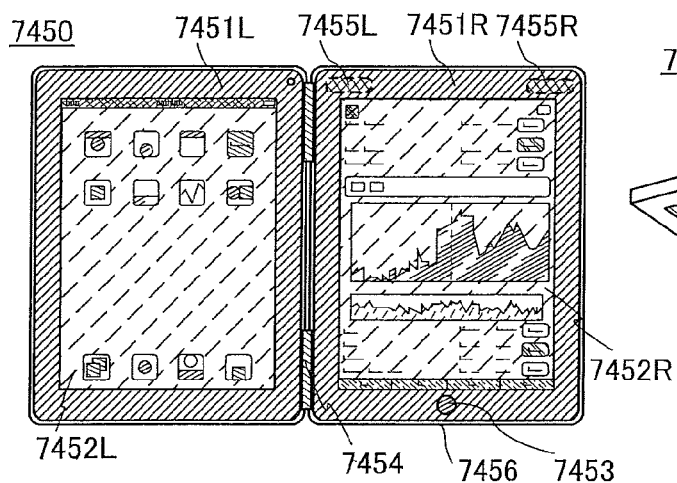

FIG. 8E illustrates an example of a foldable portable information terminal. A portable information terminal 7450 includes a housing 7451L and a housing 7451R connected by hinges 7454. The portable information terminal 7450 further includes an operation button 7453, a left speaker 7455L, and a right speaker 7455R. In addition, a side surface of the portable information terminal 7450 is provided with an external connection port 7456, which is not illustrated. Note that when the portable information terminal 7450 is folded on the hinges 7454 so that a display portion 7452L provided in the housing 7451L and a display portion 7452R provided in the housing 7451R can face each other, the display portion can be protected by the housings. The display portion 7452L and the display portion 7452R in the portable information terminal 7450, which include the light-emitting device of one embodiment of the present invention, can display images.

The portable information terminal 7450 can also include a gyroscope, an acceleration sensor, a global positioning system (GPS) receiver, or a video camera. For example, when a detection device including a sensor for detecting inclination, such as a gyroscope or an acceleration sensor, is provided, the orientation of the display screen can be automatically changed by determining the orientation of the portable information terminal 7450 (whether the portable information terminal 7450 is placed horizontally or vertically for a landscape mode or a portrait mode).

Furthermore, the portable information terminal 7450 can be connected to a network. The portable information terminal 7450 not only can display data on the Internet but also can be used as a terminal controlling another electronic device connected to the network from a distant place.

<Lighting Device>

Figure 8F:
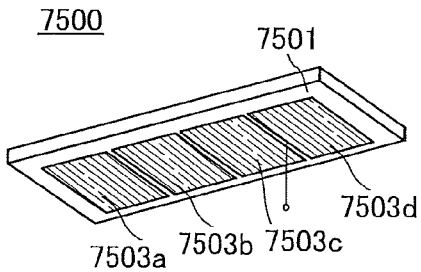

FIG. 8F illustrates an example of a lighting device. A lighting device 7500 includes light-emitting devices 7503a, 7503b, 7503c, and 7503d incorporated in a housing 7501. The lighting device 7500 can be attached to a ceiling, a wall, or the like. The light-emitting devices included in the lighting device 7500 are each the light-emitting device of one embodiment of the present invention.

This embodiment can be combined as appropriate with any of the other embodiments in this specification.

EXAMPLE

In this example, a substrate to which a method for forming projections and depressions of one embodiment of the present invention is applied is described with reference to FIG. 9.

Figure 9:
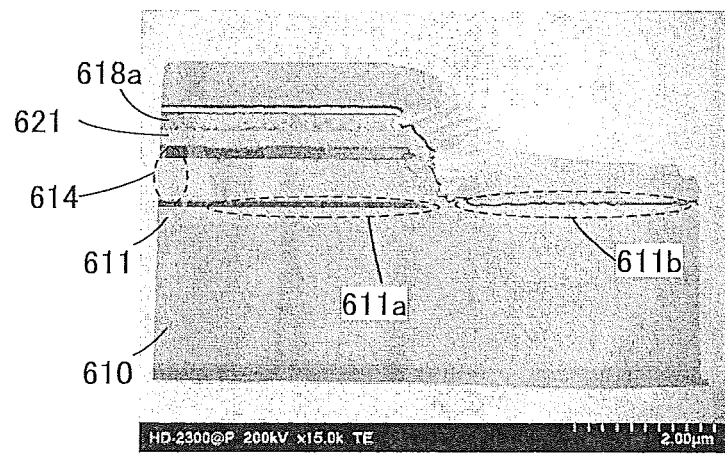
FIG. 9 is a photograph of a cross section of a substrate having projections and depressions of the example, which is taken with a scanning transmission electron microscope.

FIG. 9 is an image of a cross section of the substrate having projections and depressions formed by the method for forming projections and depressions of one embodiment of the present invention, which was taken with a scanning transmission electron microscope.

<Method for Forming Projections and Depressions>

In this example, a non-alkali glass substrate 610 over which a 200-nm-thick silicon oxynitride film 611, a stacked film 614 of a 100-nm-thick titanium film, a 600-nm-thick aluminum film, and a 200-nm-thick titanium film, and a 200-nm-thick silicon oxide film 621 were stacked was used as a substrate.

<<First Step>>

In the first step, a conductive film was formed over the silicon oxynitride film 611 by a sputtering method using aluminum containing nickel at 2 atom % and lanthanum at 0.35 atom % as a target.

<<Second Step>>

In the second step, the conductive film formed in the first step was heated at 300° C. in an air atmosphere for 60 minutes with the use of a clean oven, so that nickel segregated.

<<Third Step>>

In the third step, aluminum contained in the conductive film formed in the first step was selectively dry-etched using a mixed gas of a boron trichloride gas with a flow rate of 60 sccm and a chlorine gas with a flow rate of 20 sccm at a pressure of 1.2 Pa. Note that an inductively-coupled plasma etching apparatus was used at an electric power of 600 W and a bias power of 200 W.

<<Fourth Step>>

In the fourth step, the silicon oxynitride film 611, the stacked film 614 of the titanium film, the aluminum film, and the titanium film, and the silicon oxide film 621 were selectively etched using a residue containing nickel as a resist mask to form projections and depressions 611b. Note that the etching in the fourth step was performed under the same conditions as the third step.

<Formed Projections and Depressions>

The cross section of the substrate over which the projections and depressions were formed is described with reference to FIG. 9.

One surface of the non-alkali glass substrate 610, over which the silicon oxynitride film 611 was formed, had the projections and depressions 611b, a surface 611a that was adjacent to the projections and depressions 611b and was flatter and smoother than the projections and depressions 611b, and an island-shaped film 618a that overlapped the flat and smooth surface 611a.

Table 1 shows results of measurement of the flat and smooth surface 611a and the projections and depressions 611b by atomic force microscopy (AFM). Note that in the table, Ra means arithmetic mean roughness; P-V, the difference between the maximum peak height and the maximum valley depth; Rp, the maximum peak height; Rv, the maximum valley depth; RMS, root-mean-square roughness; and Rz, ten-point average roughness. Note that the unit is micrometer.

TABLE 1

|  | Ra | P - V | Rp | Rv | RMS | Rz |
| --- | --- | --- | --- | --- | --- | --- |
| flat and smooth surface 611a | 0.96 | 12.29 | 8.528 | -3.757 | 1.233 | 10.74 |
| projections and depressions 611b | 10.79 | 111.4 | 72.67 | -38.73 | 13.87 | 101.7 |

As shown by the above results, the projections and depressions were able to be formed over the one surface.

Furthermore, a sample was formed in which a substrate over which the projections and depressions 611b were formed was bonded to another non-alkali glass substrate with the use of a sealant containing glass with a low melting point of 450° C., and a comparative sample was formed in which a substrate over which the projections and depressions 611b were not formed was bonded to another non-alkali glass substrate with the use of the same sealant. The force needed for separating the substrate from the substrate over which the projections and depressions 611b were formed in the sample was higher than that needed for separating the substrate in the comparative sample.

This application is based on Japanese Patent Application serial no. 2013-088000 filed with the Japan Patent Office on Apr. 19, 2013, the entire contents of which are hereby incorporated by reference.

What is claimed is:

1. A sealing structure comprising:
   a substrate;
   a sealing substrate opposite a surface of the substrate;
   a sealant between the substrate and the sealing substrate; and
   a sealed structure sealed in a region surrounded by the substrate, the sealing substrate, and the sealant,
   wherein the surface of the substrate is provided with:
      projections and depressions;
      a surface being adjacent to the projections and depressions and being flatter and smoother than the projections and depressions; and
      a metal film in contact with the flat and smooth surface,
   wherein the sealant is in contact with the projections and depressions, and
   wherein the metal film comprises metal elements non-uniformly distributed.

2. The sealing structure according to claim 1,
   wherein a surface of the sealing substrate is provided with:
      projections and depressions;
      a surface being adjacent to the projections and depressions of the sealing substrate and being flatter and smoother than the projections and depressions of the sealing substrate; and
      a second film overlapping the flat and smooth surface.

3. The sealing structure according to claim 2,
   wherein the sealant is in contact with the second film which the sealing substrate is provided with.

4. The sealing structure according to claim 2,
   wherein the substrate comprises at least one of glass, ceramics, a metal, an inorganic material, and a resin.

5. The sealing structure according to claim 2,
   wherein the sealing substrate comprises at least one of glass, ceramics, a metal, an inorganic material, and a resin.

6. The sealing structure according to claim 2
   wherein the sealant contains glass whose melting point is higher than or equal to 300° C. and lower than or equal to 700° C.

7. An electronic device comprising the sealing structure according to claim 6.

8. The sealing structure according to claim 1,
   wherein the metal elements comprise nickel.

9. A light-emitting device comprising:
   a substrate;
   a sealing substrate opposite a surface of the substrate;
   a sealant between the substrate and the sealing substrate; and a light-emitting element sealed in a region surrounded by the substrate, the sealing substrate, and the sealant, wherein the surface of the substrate is provided with:
  projections and depressions;
    a surface being adjacent to the projections and depressions and being flatter and smoother than the projections and depressions
    a metal film in contact with the flat and smooth surface; and
    a conductive film overlapping with the surface, wherein the light-emitting element is electrically connected to the conductive film, wherein the sealant is adjacent to the projections and depressions, and wherein the metal film comprises metal elements non-uniformly distributed.

10. The light-emitting device according to claim 9, wherein the substrate comprises at least one of glass, ceramics, a metal, an inorganic material, and a resin.

11. The light-emitting device according to claim 9, wherein the sealing substrate comprises at least one of glass, ceramics, a metal, an inorganic material, and a resin.

12. An electronic device comprising the light-emitting device according to claim 9.

13. The light-emitting device according to claim 9, wherein the metal elements comprise nickel.

* * * * *